United States Patent [19]

Broutin et al.

[11] Patent Number: 5,925,876
[45] Date of Patent: Jul. 20, 1999

[54] OPTOELECTRONICS CIRCUIT

[75] Inventors: Scott L. Broutin, Maxatawny Township; James Kevin Plourde, Allentown, both of Pa.

[73] Assignee: Lucent Technologies Inc., Murray Hill, N.J.

[21] Appl. No.: 08/932,838

[22] Filed: Sep. 18, 1997

[51] Int. Cl.⁶ .................................................. H01J 40/14
[52] U.S. Cl. .............................. 250/214 R; 250/214 AG; 372/22
[58] Field of Search ............................ 250/214 R, 214.1, 250/214 LS, 214 A, 214 RC, 214 AG; 372/22, 96

[56] References Cited

U.S. PATENT DOCUMENTS 4,243,943  1/1981  Cherry ..................................... 330/107

*Primary Examiner*—Que T. Le
*Attorney, Agent, or Firm*—L. H. Birnbaum

[57] ABSTRACT

The invention is a circuit for eliminating or reducing unwanted components from an optical output signal. The circuit employs a photodetector for converting a portion of the output signal to an electrical signal, and a feedback loop which passes only the second harmonic band or the frequency difference band for combining with the input biasing signal.

8 Claims, 1 Drawing Sheet

OPTOELECTRONICS CIRCUIT

FIELD OF THE INVENTION

This invention relates to circuits for operating optical devices.

BACKGROUND OF THE INVENTION

In many optical applications, linearization of the optical device is an important consideration. For example, semiconductor lasers used for analog applications such as wireless transmission generally need to exhibit linearity.

Negative feedback is a standard technique for achieving linearity. In such techniques, a portion of the optical output is tapped off, converted to an electrical signal, and fed back to the drive circuit. In the normal method, the feedback cancels out a portion of the in-band signal thus producing a reduction in the gain of the system. Consequently, improvement in linearity is limited by the amount of gain reduction which is acceptable. Furthermore, difficulty is often encountered in controlling the amplitude and phase of the negative feedback loop in order to avoid unwanted oscillations of the circuit.

SUMMARY OF THE INVENTION

The invention is a circuit which includes an optical device and means for applying an input electrical signal band for biasing the device including at least two frequencies. The circuit further includes means for receiving at least a portion of the optical output from the device, converting the optical output to an electrical signal, and means for feeding back the resulting electrical signal to the biasing means. The circuit further includes means for passing only the portion of the electrical band selected from the group consisting of the second harmonic band and the frequency difference band in the means for feeding back to the biasing means.

BRIEF DESCRIPTION OF THE DRAWINGS

These and other features of the invention are delineated in detail in the following description. In the drawing.

It will be appreciated that, for purposes of illustration, these figures are not necessarily drawn to scale.

DETAILED DESCRIPTION

Figure 1:
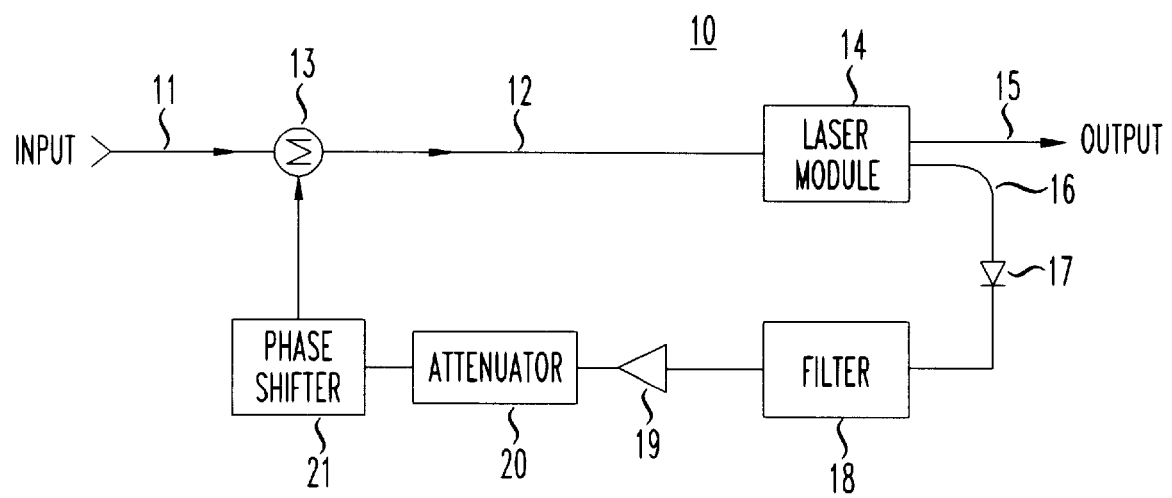
FIG. 1 is a schematic diagram of a circuit according to an embodiment of the invention.

FIG. 1 is an example of a circuit, 10, which utilizes the principles of the invention. An input electrical signal is received on conductor, 11, and applied to conductor, 12, through a summing circuit, 13. The electrical signal is applied to a standard laser module, 14, which includes a semiconductor laser and necessary electrodes for applying the electrical signal to the laser to produce an optical output. The optical output is coupled to an optical fiber, 15, for transmission.

A portion of the optical output is coupled by means of a tap, 16, to a photodetector, 17, so that this portion of the optical signal is converted to an electrical signal. Alternatively, the light from a backface of the laser could be incident on the photodetector in accordance with known techniques. The output of the photodetector, 17, is connected to a filter, 18, which could be a high pass, low pass or band pass filter. The filter output is connected to an amplifier, 19.

The amplifier output is connected to an attenuator, 20 whose output is connected to a phase shifter, 21. The photodetector, 17, filter, 18, amplifier, 19, attenuator, 20, and phase shifter, 21, can all be considered part of a feedback circuit in accordance with the invention. The output of the phase shifter, 21, is connected to the summing circuit, 13.

The operation of the circuit will now be described assuming an input signal having the form:

$$v_i(t) = a_1 \cos 2\pi f_1 t + a_2 \cos 2\pi f_2 t \qquad (1)$$

where $a_1$ and $a_2$ are constants, $f_1$ and $f_2$ are the input frequencies, and t is time. (It is understood that the invention operates over a band of frequencies, but assuming a two tone input within the operating band is a common method of characterizing the linearity of operation.) Further, nonlinearity in the output signal, $v_o(t)$ is represented by the series:

$$v_o(t) = g_0 + g_1 v_i(t) + g_2 v_i^2(t) + g_3 v_i^3(t) + \qquad (2)$$

where $g_0$, $g_1$, $g_2$, and $g_3$ are constants. It will be recognized that the term $g_1 v_i(t)$ is the linear term, while $g_2 v_i^2(t)$ and $g_3 v_i^3(t)$ yield the second and third order terms, respectively, of the output signal. For convenience, it is assumed that higher order terms can be neglected.

For wireless applications, which are narrow band, only the third order terms fall within the band of interest and need to be removed.

Figure 2:
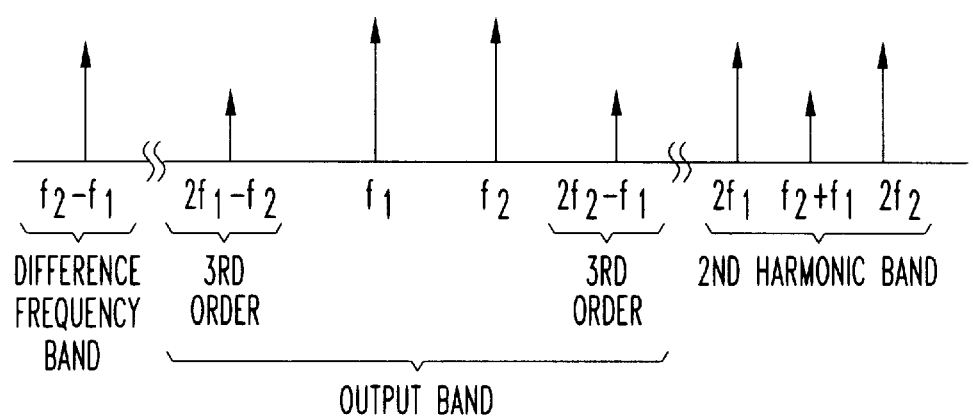
FIG. 2 is a diagram of a frequency spectrum of the output of the circuit of FIG. 1.

Substituting equation (1) into equation (2) yields the following third order products which fall within the operating band:

$$(3/4) a_1 a_2^2 g_3 \cos (4\pi f_2 t - 2\pi f_1 t) \qquad (3)$$

$$(3/4) a_1^2 a_2 g_3 \cos (4\pi f_1 t - 2\pi f_2 t) \qquad (4)$$

where term (3) is the upper third order sideband and term (4) is the lower third order sideband. These terms are also illustrated in the spectrum of FIG. 2.

Now considering the second order term ($g_2 v_i^2(t)$) of equation (2) and substituting therein the signal of equation (1), the following terms, among others, will result:

$$(a_1^2 g_2/2) \cos (4\pi f_1 t) \qquad (5)$$

$$(a_2^2 g_2/2) \cos (4\pi f_2 t) \qquad (6)$$

$$a_1 a_2 g_2 \cos (2\pi f_2 t - 2\pi f_1 t) \qquad (7)$$

$$a_1 a_2 g_2 \cos (2\pi f_1 t + 2\pi f_2 t) \qquad (8)$$

where terms 5 and 6 are the second harmonic signals included within the second harmonic band, term 7 is the difference signal which is part of the difference frequency band, and term 8 is the sum term also included in the second harmonic band (See FIG. 2). In accordance with a key feature of the invention, the filter, 18, may be chosen to pass only the second harmonic band (terms 5 and 6 along with the sum signal (term 8)) or only the difference band (term 7). As shown below, the amplitude or phase of such feedback signals can be adjusted by components 19 or 20 and/or 21 so that these terms, which are out of the output band of interest, can nevertheless be used to cancel or reduce the third order terms which are in-band when added to the input signal by summing circuit 13, thereby improving the linearity of the optical device. Specifically, for the case of feeding back the second harmonic signals, the input signal becomes:

$$v_i(t) = a_1 \cos 2\pi f_1 t + a_2 \cos 2\pi f_2 t + (k a_1^2 g_2/2) \cos 4\pi f_1 t + (k a_2^2 g_2/2) \cos 4\pi f_2 t \qquad (9)$$

where k is the amount by which the feedback signals are increased or decreased by the components 18–20. When this input is substituted in the second order term of equation (2), among the terms produced are:

$$(ka_1 a_2^2 g_2^2/2) \cos(4\pi f_2 t - 2\pi f_1 t) \qquad (10)$$

and $$(ka_1^2 a_2 g_2^2/2) \cos(4\pi f_1 t - 2\pi f_2 t) \qquad (11)$$

Thus, term (10) can cancel out the unwanted third order term (3) and term (11) can be used to cancel out the unwanted third order term (4) if:

$$k = -(3/2)(g_3/g_2^2) \qquad (12)$$

In the example of feeding back the difference signal (equation 7), a similar analysis reveals:

$$k = -(3/4)(g_3/g_2^2) \qquad (13)$$

Thus, it will be noted that, by passing either the second harmonic frequency band or the difference frequency band in filter, 18, and providing gain or attenuation by components 19 and 20 in accordance with equations (12) or (13), the third order terms can be eliminated from the output signal.

For mathematical simplicity, k was assumed to be real and phase was not taken into consideration. However, a means to adjust the phase of the feedback terms may be required in order to satisfy the equations (12) or (13). For this reason, the phase shifter, 21, is included in the feedback path. Also note that the sum term, (8), is included in the second harmonic frequency band but does not contribute to the cancellation effect described on the previous pages.

Further, while the filter, 18, has been shown as a separate element, it could be integral with the amplifier, 19, or other components in the feedback path.

The invention claimed is:

1. A circuit comprising:
   an optical device;
   means for applying an input electrical signal band including at least two frequencies for biasing the device;
   means for receiving at least a portion of the optical output signal from the device and for converting the optical signal to an electrical signal including a second harmonic band and a band including the difference of the two input frequencies; and
   means for feeding a signal related to the resulting electrical signal from the receiving means and converting means to the biasing means, the feed back means including means for passing only the portion of the electrical signal selected from the group consisting of the second harmonic band and the frequency difference band.

2. The circuit according to claim 1 wherein the means for passing comprises a filter.

3. The circuit according to claim 1 wherein the means for feeding back includes a filter, an amplifier, an attenuator, and a phase shifter.

4. The circuit according to claim 1 wherein the means for biasing includes a summing circuit for combining the input electrical signal band and the portion of the resulting electrical signal passed by the means for feeding back.

5. The circuit according to claim 1 wherein the means for receiving and converting comprises a photodetector.

6. The circuit according to claim 1 wherein the input electrical signal has the form $$v_i(t) = a_1 \cos 2\pi f_1 t + a_2 \cos 2\pi f_2 t$$

where $v_i(t)$ is voltage as a function of time, t, $a_1$ and $a_2$ are constants, and $f_1$ and $f_2$ are frequencies.

7. The circuit according to claim 6 wherein the electrical signal fed back to the biasing means has the form $$(ka_1^2 g_2/2) \cos 4\pi f_1 t + (ka_2^2 g_2/2) \cos 4\pi f_2 t$$

where k is the amount by which the resulting electrical signal from the receiving and converting means is altered by the feedback means, and $g_1$ and $g_2$ are constants from the signal produced by the receiving and converting means.

8. The circuit according to claim 6 wherein the electrical signal fed back to the biasing means has the form $$ka_1 a_2 g_2 \cos(2\pi f_2 t - 2\pi f_1 t)$$

where k is the amount by which the resulting electrical signal from the receiving and converting means is altered by the feedback means, and $g_1$ and $g_2$ are constants from the signal produced by the receiving and converting means.

* * * * *